(12) United States Patent
Chung et al.

(10) Patent No.: US 6,535,026 B2
(45) Date of Patent: Mar. 18, 2003

(54) HIGH-SPEED SENSE AMPLIFIER WITH AUTO-SHUTDOWN PRECHARGE PATH

(75) Inventors: Cheng-Lin Chung, Hsinchu (TW); Nien-Chao Yang, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 09/845,475

(22) Filed: Apr. 30, 2001

(65) Prior Publication Data

US 2002/0158672 A1 Oct. 31, 2002

(51) Int. Cl.$^7$ .............................................. G01R 19/00
(52) U.S. Cl. ........................................... 327/51; 327/57
(58) Field of Search ...................... 327/51–57

(56) References Cited

U.S. PATENT DOCUMENTS

| | | | |
|---|---|---|---|
| 4,763,026 A | * 8/1988 | Tsen et al. | 327/56 |
| 4,788,460 A | 11/1988 | Kobatake | 327/51 |
| 5,056,063 A | 10/1991 | Santin et al. | 365/208 |
| 5,258,669 A | * 11/1993 | Nakashima | 327/51 |
| 5,388,078 A | * 2/1995 | Arakawa | 327/103 |
| 5,771,196 A | 6/1998 | Yang | 365/207 |
| 6,297,670 B1 | * 10/2001 | Chao et al. | 327/51 |

* cited by examiner

Primary Examiner—Kenneth B. Wells
(74) Attorney, Agent, or Firm—Mark A. Haynes; Haynes Beffel & Wolfeld LLP

(57) ABSTRACT

A sense amplifier inverts the output from the pass transistor to control a pre-charge transistor. The combination of the inverter and pre-charge transistor pre-charges the output to a level just below the flip level of the following data latch circuit. If the data cell read is a low threshold cell (conductive or "1"), the output level does not significantly change, and the data is rapidly latched and read. If the data cell is a high threshold cell (non-conductive or "0"), the pass transistor shuts off and the output is pulled up above the flip level of the data latch circuit through a pull-up path. The pre-charge level is near the flip level, so the output does not have to be pulled up very far, thus reading a "0" is also fast. In one embodiment, the pull-up transistor is a p-channel MOSFET with the gate grounded, thus providing more constant current than a diode-connected configuration. In another embodiment, the pull-up transistor is operated as a current mirror using a cell in a mini array. The first inverter of the data latch circuit can be used in the feedback path to the precharge transistor, or a separate feedback inverter can be provided.

18 Claims, 8 Drawing Sheets

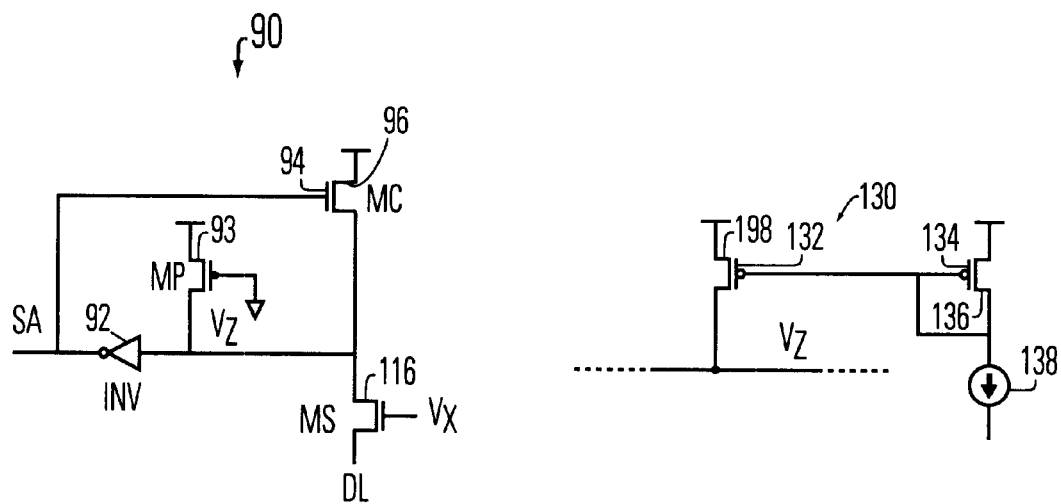
FIG. 3A  FIG. 5
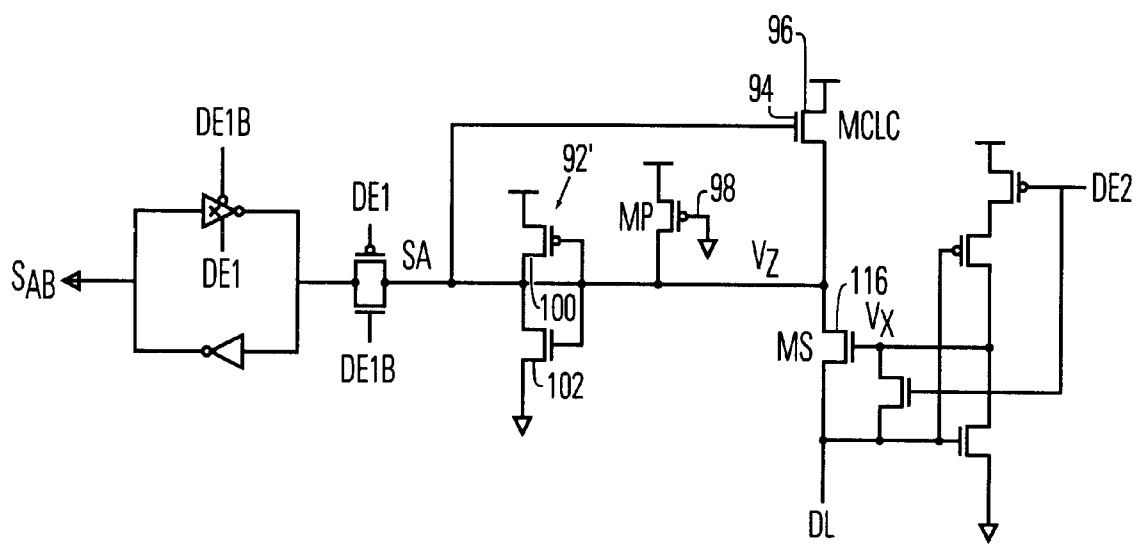
FIG. 3B

HIGH-SPEED SENSE AMPLIFIER WITH AUTO-SHUTDOWN PRECHARGE PATH

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates to integrated-circuit memory arrays, and in particular, to sensing of currents during reading of such memory arrays to determine the value of a logic level stored in a memory cell of the memory array.

BACKGROUND OF THE INVENTION

Sense amplifiers are typically used to read the state of memory cells in a memory array, such as read-only memory (ROM) arrays, programmable read-only memory (PROM) arrays, and erasable programmable read-only memory (EPROM) arrays, among others. A memory cell typically stores charge to indicate the logic state of the memory cell. The logic state might be binary ("1" or "0") or might be multi-level for higher order logic. A typical ROM array may contain millions of memory cells, typically arranged in rows and columns. Some memory arrays use floating-gate field-effect transistors (FETs) as the memory cell device, with the sources of each cell in a column being connected to a source-column line, and the source-column line for a selected cell may be connected to a reference voltage or ground (zero voltage) when the selected cell is read by the sense amplifier.

The drains of each cell in a column are connected to a separate bit-line (drain-column line), and the drain-column line for a selected cell is connected to the input of the sense amplifier when the selected cell is read. The control gates of each cell in a row are connected to a word line, and the word line for a selected cell is connected to the predetermined select voltage during reading of the selected cell. When the cell is read, the current through the selected cell is compared to a reference current to determine whether the selected cell is programmed with a "1" or a "0".

In some conventional devices, the reference circuitry is connected to the input of a current-sensing amplifier and the output of this current-sensing amplifier is connected to one input of a differential amplifier. The differential amplifier compares the voltage output of the current-sensing amplifier with the voltage output of a second current-sensing amplifier connected to the memory cell being read. The reference current is typically chosen to provide a clear indication of the memory cell state being read.

However, errors in reading the state of the memory cell can arise. One of the problems encountered when using sense amplifiers is that the capacitance of the drain-column line can affect the initial current from the sense amplifier. These current surges can cause an error in reading the true state of the memory cell if sufficient time is not allowed for the drain-column line to settle. Providing sufficient settling time for a worst-case scenario slows operation of the memory array, which is undesirable, especially if the memory array is desired to be used with a fast microprocessor.

Pre-charging the drain-column line is one way to avoid the settling time associated with in-rush current, but pre-charging may have undesirable effects as well. While the use of pre-charge circuitry can improve access time, conventional pre-charge circuits can draw a large amount of current from the voltage supply. Pre-charging can also introduce timing issues. The pre-charging should be on long enough to insure that the drain-column line is sufficiently charged to avoid data sensing errors, but not so long as to unduly slow operation of the memory array.

Some of the chip area and current draw required by pre-charge circuitry can be at least partially offset by eliminating the differential amplifier used in two-stage sense circuits. In one single-stage sense amplifier, the output of the sense amplifier is set to a default state (e.g. the "0" state). The output only needs to be set if it is not the same as the default output value, thus the sensing margin can be improved. When the default data is "0", the sensing speed can be limited by the cell current. If the cell current is large, data "1" speed is fast, but if the cell current is low, then data "1" speed is slower. Different cells in the memory array may provide different cell currents when read, so it may be necessary to provide a read period sufficient for the lowest cell current.

Timing of the pre-charge cycle can be simplified if the pre-charging is automatically stopped when the desired default value is reached. One pre-charge circuit uses a pair of series-connected FETs between a positive bias voltage supply and the data line with the output of the sensing amplifier being connected between the FETs. The FETs are gated with the inverse of the input value, in other words, when the input value is low, the gate voltage is high, and the FETs turn on and supply the output node with current from the positive voltage supply. When the input value is high, the gate voltage is low, and the FETs turn off, blocking the current path from the voltage supply. However, the the threshold voltage of the first (precharge) transistor is chosen so that, when the FETs are on, the precharge transistor has a low conductivity channel with respect to the second (pass) transistor. When the input value is low, the FETs are turned on and the output is pulled low. When the input value is high, a depletion-mode FET with the gate connected to the output is provided between the positive supply and the output of the sense amplifier to provide current from the positive voltage supply to the sense amplifier output and pull the output to a high state.

However, the series-connected FETs are relatively large in order to efficiently pre-charge the output, and this loads the gate bias circuit, slowing operation. Similarly, the depletion-mode pull-up transistor loads the sense amplifier output, which is also undesirable. In this type of circuit, the output of the sense amplifier tracks the data level, offset by about 200 mV higher than the data level. This may not be the optimum voltage for the next stage, which is typically an inverter and latch with a complementary metal-oxide-semiconductor (CMOS) circuit that might draw leakage current if not properly biased off.

The problems associated with using a depletion-mode FET between the output and the positive voltage supply have been addressed by using a diode-connected p-channel FET with the gate connected to the output of the sense amplifier.

The level of the output swing can be reduced, but the output level still might not be appropriate for the next stage, and current may be drawn through the next stage, even in stand-by mode. Thus, there is a need to develop a sense amplifier with a pre-charge path that automatically shuts when the proper value is reached, and produces a value consistent with the stage following the sense amplifier. It is further desirable that the sense amplifier be low power, have a small layout area, and have improved sensing speed.

SUMMARY OF THE INVENTION

Sense amplifiers according to the present invention automatically shut down the pre-charge path before sensing the bit value by controlling a precharge path with an inverted output signal. The default data condition is a low Vt state, thus avoiding pre-charging the bit line high before going low when reading a low threshold (conductive) cell. In one embodiment, a pull-up path is provided by a p-channel MOSFET with the gate connected to ground to avoid DC leakage through the CMOS data latch in standby mode. The ground connection also provides an essentially constant $V_{GS}$, unlike diode-connected pull-up transistors.

Sense amplifiers generally have an input node capable of being connected to a bit line of a memory array with a pass transistor connected between the input node (data line) and an output node. According to one embodiment of the present invention, an inverter inverts the signal at the output node and provides the inverted signal to the gate of a precharge transistor. The precharge supplies current from the supply ($V_{DD}$) to the output node. The combination of the inverter and the pre-charge transistor pre-charges the output to a level just below the flip level of the following sensing inverter of the data latch stage when the sense amplifier is enabled.

If the data cell is in a conductive ("1") state, the pass transistor turns on and the output is maintained at essentially the pre-charge level during the data latch period. If the data cell is in a non-conductive ("0") state, the pass transistor is turned off and the output is pulled up over the flip level of the sensing inverter by the pull-up transistor that couples the output node to $V_{DD}$. This pull-up period is short because the pre-charge level is close to the flip level of the next stage.

In a particular embodiment a sense amplifier having an input node configured to be connected to a bit line of a memory array includes a pass transistor with a first pass conduction terminal connected to the input node and a second pass conduction terminal connected to an output node. An inverter with its input coupled to the output node provides a pre-charge bias voltage at an inverter output. The inverter output is coupled to a control terminal of a pre-charge transistor. A first conduction terminal of the pre-charge transistor is configured to be connected to a voltage supply providing a bias voltage, and a second conduction terminal of the pre-charge transistor is connected to the output node. A pull-up transistor has a first pull-up conduction terminal configured to be connected to the voltage supply and a second conduction terminal connected to the output node.

In some embodiments the sensing inverter of the latch stage is used to invert and feedback the data output through the pre-charge transistor. In other embodiments, a separate inverter is supplied. In either instance, the pre-charge level is set below but close to the flip level of the inverter. In a further embodiment, a diode connection is provided in a CMOS inverter in the data latch circuit to avoid DC current draw when the sense amplifier is in standby.

In one embodiment, a sense amplifier having an input node configured to be connected to a bit line of a memory array includes a pass transistor having a first pass conduction terminal connected to the input node and a second pass conduction terminal connected to an output node. An inverter has its input coupled to the output node and provides an inverter output to a control terminal of a pre-charge transistor. A first conduction terminal of the pre-charge transistor is configured to be connected to a voltage supply providing a bias voltage, and a second conduction terminal is connected to the output node. A pull-up transistor has a first pull-up conduction terminal configured to be connected to the voltage supply and a second pull-up conduction terminal connected to the output node. The gate terminal of the pull-up transistor connected to a ground potential. A latch circuit having a second inverter including a complementary pair of transistors with a common control node is coupled to the inverter output. A diode connection is connected in series with the complementary pair of transistors between the voltage supply and the ground potential.

BRIEF DESCRIPTION OF THE DRAWINGS

FIG. 3A is a simplified portion of a sense amplifier illustrating the present invention.

FIG. 3B is a simplified schematic representation of a sense amplifier using a sensing inverter to control precharging according to an embodiment of the present invention.

FIG. 5 is a simplified circuit diagram of the precharge transistor operated as a current mirror according to an embodiment of the present invention.

DETAILED DESCRIPTION OF EMBODIMENTS OF THE INVENTION

The present invention comprises a novel sense amplifier design. The following description is presented to enable any person skilled in the art to make and use the invention. Descriptions of specific applications are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

The present invention provides a sense amplifier with an un-clocked pre-charge circuit that reduces the power requirements of the sense operation and simplifies circuitry. The pre-charge circuit uses a "smart" feedback path that can bias the sense output level and automatically shuts off. The default data value is "1", which provides a wide sensing margin and avoids low cell current issues associated when the default value is "0", and can be biased just below the threshold level of the next stage, further improving speed.

In order to understand the distinction between the present invention and the prior art, operation of portions of the sense amplifier and related memory cells will be illustrated using simplified circuit diagrams. Then, operation of certain prior art sensing amplifiers will be described.

Figure 1A:
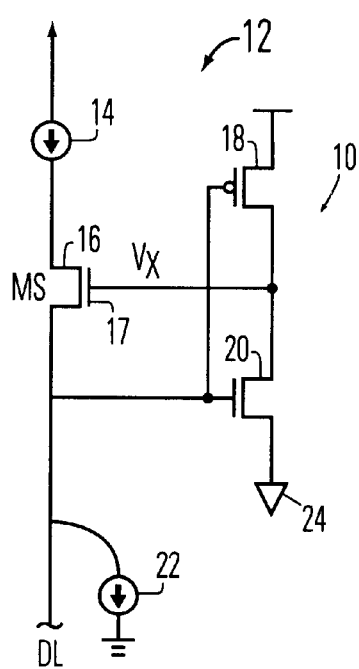
FIG. 1A is a simplified circuit diagram of a portion of sense amplifier circuit illustrating biasing of the pass transistor.

FIG. 1A is a simplified circuit diagram of a transfer bias circuit 10 of a sense amplifier 12. Only a portion of the sense amplifier and transfer bias circuit are shown for simplicity of illustration. Other transfer bias circuits are possible, typically with additional components. A current supply 14 provides current to the data line DL through the pass transistor 16. The pass transistor is controlled, i.e. turns on and off, according to the transfer bias voltage $V_X$. The p-channel metal-oxide-semiconductor ("MOS") field effect transistor ("FET") 18 and n-channel MOS FET 20 are part of the transfer bias network that produces the transfer bias voltage and, in this case, inverts the voltage on the data line DL and provides the inverted signal ($V_X$) to the control terminal (gate) 17 of the pass transistor. Thus, if the voltage level on the data line goes up, the transfer bias voltage goes down, and the pass transistor turns off. A small leakage on the data line, represented by the current supply 22 to ground 24, will cause the data line voltage to drop. If the data line level goes down, the transfer bias voltage $V_X$ goes up and turns on the pass transistor. This current through the pass transistor raises the voltage level on the data line, thus the data line is biased to a certain level with small variation.

Figure 1B:
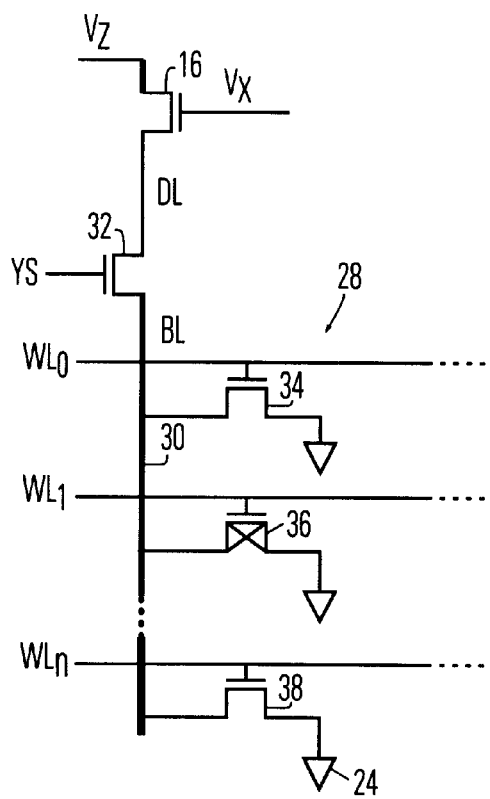
FIG. 1B is a simplified circuit diagram of a portion of a memory array coupled to the pass transistor through a switch.

FIG. 1B is a simplified circuit diagram of a portion of a memory array 28 illustrating a bit line 30. The bit line BL is coupled to the data line DL (ref. to FIG. 1A) and then to the pass transistor 16 through a switch 32 controlled by switching signal $Y_S$. A first wordline WL0 controls memory cells connected to the wordline, such as the data "1" cell 34. This cell conducts current between the bitline and ground when the cell is activated by its wordline WL0. This type of cell will be called a "low threshold" cell for purposes of discussion.

A second wordline WL1 controls another memory cell 36. This cell is in a non-conductive or high threshold condition and will be defined as a cell in a "0" state. It is understood that the terms "1" and "0" are chosen for purposes of discussion only to allow convenient discussion of examples of circuit operation. In this state the cell conducts essentially no current between the bit line and ground when activated by the wordline. Additional wordlines typically control additional memory cells, such as wordline WLn and the low threshold cell 38 connected between the bitline BL and ground 24.

Many cells are typically connected to the bitline BL, which loads the bitline and its initial level is low, but not necessarily at ground level. When a cell is selected to be read, it is desirable to precharge the bitline to a certain level to have sufficient cell current. For example, if a low threshold cell is selected and the bitline is at a low level (not appropriately precharged), very little cell current might flow through the cell to ground because of the small voltage difference between the bitline and ground. This low current may require a relatively long period in order to correctly read the cell. Precharging the bitline can improve the speed of the circuit. Some conventional circuits use a clock signal to precharge the bitline before reading the memory cell. Such a circuit is discussed in greater detail in relation to and FIGS. 1C, 1D, and FIG. 2A, below.

Figure 1C:
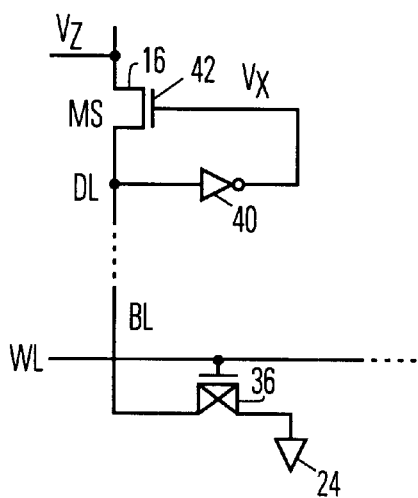
FIG. 1C is a simplified circuit diagram of a portion of a sense amplifier and memory array illustrating reading a high threshold cell.

FIG. 1C is a simplified circuit diagram of a portion of a sense amplifier illustrating precharging with a high threshold (no current) cell 36. An inverter 40 between the data line DL and the gate 42 of the pass transistor 16 controls the pass transistor. Thus, the transfer bias level $V_X$ is the inverse of the data line level. The high threshold cell is essentially an open circuit between the bitline BL and ground 24 when the wordline WL1 is enabled. The data line is precharged to a certain level, since the cell conducts no current from the bit line, the data line is precharged slightly higher, causing the transfer bias voltage $V_X$ to drop, shutting off the pass transistor 16. Thus, the data output $V_Z$ is high and the data line DL keeps its level.

Figure 1D:
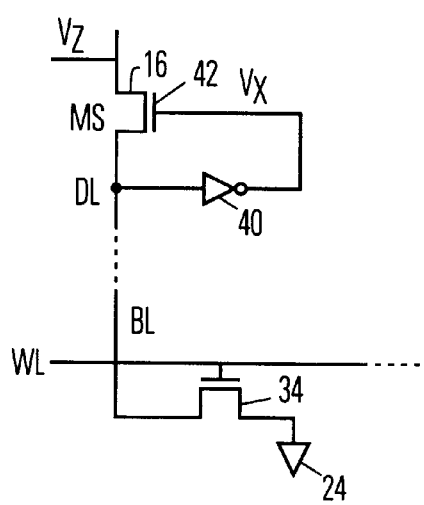
FIG. 1D is a simplified circuit diagram of the portion of the sense amplifier and memory array of FIG. 1C illustrating reading a low threshold cell.

FIG. 1D is a simplified circuit diagram of a portion of the sense amplifier of FIG. 1C illustrating precharging with a low threshold memory cell 34. Again, the data line DL is precharged to a certain level. If the memory cell 34 conducts current from the bit line BL to ground 24, the data line level drops (refer to FIG. 1B, ref. num. 32 illustrating the switch connecting the bit line to the data line). The memory cell can typically conduct about 20 microamps. As the data line level drops, the transfer bias voltage $V_X$ rises and the pass transistor 16 turns on to supply the current the memory cell is passing to ground. The data output $V_Z$ is pulled down to a lower level. Pulling the data output level down below the flip point of the subsequent stage (an inverter that is not shown in this figure; refer to FIG. 3B, ref. num. 92') allows reading the data value of the cell(s).

Figure 2A:
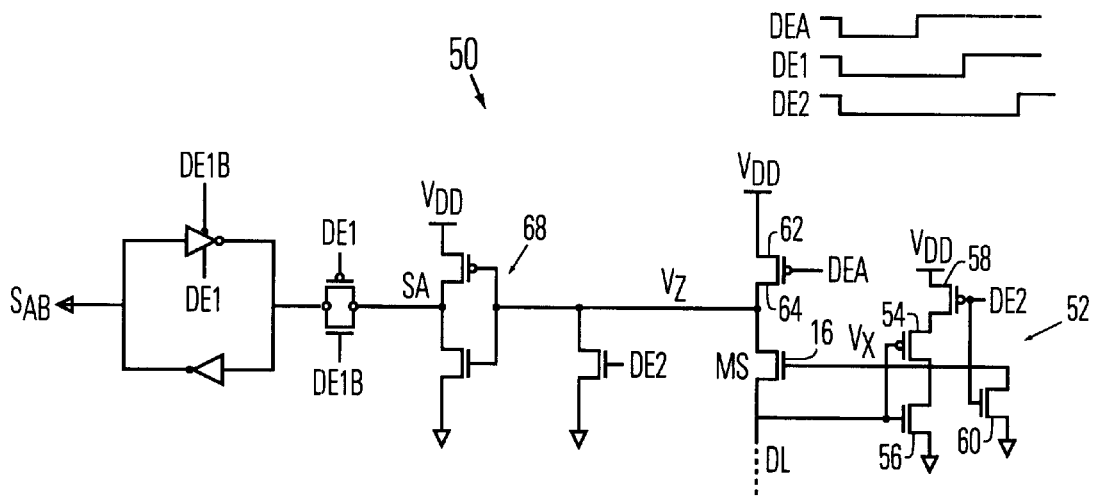
FIG. 2A is a simplified circuit diagram of a prior art sense amplifier using a clocked precharge technique.

FIG. 2A is a simplified schematic representation of a prior art sense amplifier 50. Memory cells (not shown) are coupled to the data line DL as described in conjunction with FIGS. 1B–1D, above. A bias network 52 includes a p-MOS FET 54 and an n-MOS FET 56, similar to the bias network illustrated in FIG. 1A and additional FETs 58, 60 controlled by the sense amplifier enable clock signal DE2. The clock signals DEA, DE1, and DE2 are illustrated in the upper corner of FIG. 2A for reference so that operation of the circuit may be understood better. These clock signals are discussed in further detail in reference to FIG. 7.

The circuit illustrated in FIG. 2A uses the precharge period clock signal DEA to precharge the bitline (not shown) through the switch (ref. num. $Y_S$, FIG. 1B) coupling the data line DL to the bitline. The precharge period clock signal DEA is applied to the gate 62 of the precharge transistor 64, as indicated by "DEA" next to the gate. Similar conventions are used to illustrate the ports to which the data latch signal DE1, the inverse data latch signal DE1B, and the sense amplifier enable signal DE2 are applied.

During the precharge period, the data output $V_Z$ is set to a high level. If the cell being read is a low threshold cell, current is passed from through the switch (see FIG. 1B, ref. num. 32) to the bit line to ground, and the voltage level of the data line DL drops. As the data line level drops, the transfer bias voltage level $V_X$ rises, turning on the pass transistor 16, causing the data output level to drop.

If the cell being read is a high threshold cell, the cell does not conduct current from the data line DL (via the bit line), the data line level is slightly higher, the transfer bias voltage $V_X$ level drops, shutting off the pass transistor. Thus, the data output level remains relatively high.

However, timing of the precharge period with the DEA clock signal is important.

The DEA clock signal controls the precharge transistor 64. It is desirable to turn on the precharge transistor long enough to precharge the data line DL from $V_{DD}$ (a positive supply voltage in this example), but not too long. If the precharge period is too long, operational speed of the circuit suffers, while if the precharge period is too short, precharging might not be completed and the wrong data might be read. Unfortunately, process variations make it difficult to appropriately control the precharge period in each process corner.

In this type of circuit, the default data level is "0", which means that the data output $V_Z$ is high (i.e. it is pulled up over the flip point of the next inverter 68) through the precharge transistor 64. In a typical memory array, different cells draw different amounts of current when storing a data "1" (low threshold or conductive state). The "tail" bit (smallest cell current) can be difficult to read because the low current conduction through the memory cell allows the data output voltage to remain high for a relatively long period of time (compared to a data "1" cell with high or average current conduction). This means that the time required to read the tail bit can be long. Additionally, turning on the precharge transistor 64 with the DEA clock signal can result in a strong precharge current and can cause the bit line to overshoot.

Since the default data output is "0", which sets the data output $V_Z$ to a high level, and $V_Z$ is initially at ground, reading a low threshold cell (when the DEA signal goes low to enable precharging) causes the data output $V_Z$ to first go high, and then be pulled low by the cell current. When a high threshold cell is read, the data output $V_Z$ level is high from the precharge cycle, and the data output only drops a little due to leakage current. Thus, reading a "1" cell can take longer than reading a "0" cell, especially if the tail bit requires a relatively long time to develop the data "1" output. Similarly, if the data line DL is precharged too high, the transfer bias voltage $V_X$ drops, shutting off the pass transistor. If a low threshold cell is being read, one must wait for the small cell current to pull the data line level lower to allow the transfer bias voltage to raise in order that the data output $V_Z$ level can be brought down. Thus the speed of the circuit can suffer if the data line DL is precharged too high (referred to as "overshoot").

Figure 2B:
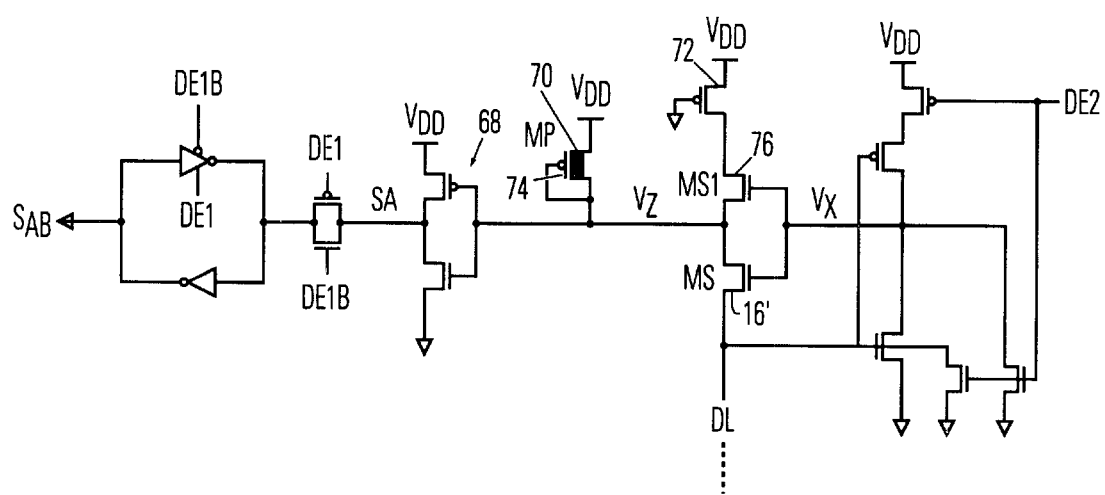
FIGS. 2B–2C are simplified schematic representations of prior art sense amplifiers.

FIG. 2B is a simplified schematic diagram of a prior art sense amplifier 40 addressing some of the problems identified with the sense amplifier illustrated in FIG. 2A. In this circuit, a depletion p-MOS transistor is used as a pull-up transistor 70. This precharge path automatically shuts down, thus the need to control the precharge period with a clock signal (refer to DEA, FIG. 2A) is eliminated. Eliminating the need for a pre-charge clock signal avoids the associated chip area and power consumption associated with this clock. However, the pass transistor 16' and the pre-charge transistor 72 are relatively large in order to efficiently pre-charge the data output $V_Z$. For example, the pre-charge transistor 72 might have a gate length of about 0.6 microns and a gate width of about 20 microns and the pass transistor 16' a width of about 6 microns and a length of about 0.6 microns. These large transistors heavily load the pass bias voltage line $V_X$, which slows operation of the sense amplifier.

This circuit has a default data output value of "1", thus avoiding the issue of first charging and then discharging $V_Z$ when reading a low threshold cell. The depletion-type pMOS pull-up transistor 70 has its gate 74 coupled to the data output $V_Z$. For example, when the bias circuit provides a high output, the n-type precharge transistor 76 turns on (in addition to the pass transistor 16') and supplies the data output $V_Z$ with current from the bias voltage source $V_{DD}$, dropped through the p-type precharge transistor 72. When the transfer bias voltage $V_X$ is low, the n-type pre-charge transistor 76 turns off, blocking the current path from $V_{DD}$ to $V_Z$. However, the threshold voltage of the pre-charge transistor is selected so that only a low-conductivity channel (with respect to the pass transistor 16') is produced when the transfer bias voltage line $V_X$ is high.

However, the data output level tracks the DL level, typically being about 200 mV higher, and not the trip point of the next stage (sense inverter 52). The depletion-type pull-up transistor 70 has its gate connected to its source, and operates as a load transistor, which loads the signal output $V_Z$ thus slowing the sense operation. It must carry enough current to improve sensing a high threshold ("0" or no current) cell, which may cause a failure in reading a low threshold cell in a fast clock corner. Precharge starts when the sense amplifier is enabled (see DE2, FIG. 2A). The data output $V_Z$ is at a relatively low level. If a low threshold cell is read, the cell current keeps the data line DL level low and the data output is "1". If a high threshold cell is read, the pass transistor 16' turns off after precharge stops and the data output $V_Z$ level is pulled up by the pull-up transistor 70 over the trip point of the next inverter 68 and the data output is "0". Again, the precharge stops automatically when the data output level rises to the intended level; however, this level is not necessarily close to the flip point of the next inverter.

Figure 2C:
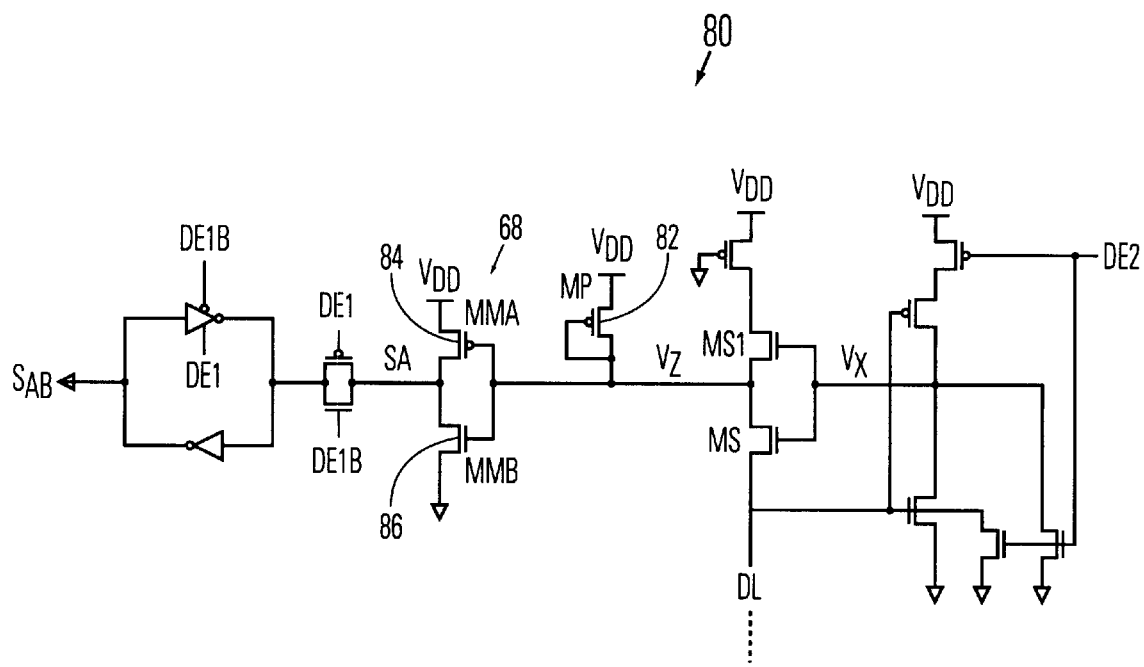

FIG. 2C is a simplified schematic diagram of a prior art sense amplifier 80 addressing the problem of data output $V_Z$ loading encountered with the sense amplifier discussed in association with FIG. 2B. The pull-up transistor 82 is an enhancement-mode pMOS transistor, rather than a depletion-mode pMOS transistor, as shown in FIG. 2B, reference numeral 70. This pull-up transistor 82 is also diode connected (i.e. its source is connected to its gate). The diode connection makes the data output $V_Z$ level at approximately $V_{DD}-V_{TP}$ when the sense amplifier is disabled, which can cause current to flow in the transistors 84, 86 in the next inverter 68, even in stand-by mode. Such current flow is particularly undesirable in battery-operated devices.

3. Exemplary Sense Amplifier Circuits

FIG. 3A is a simplified circuit diagram of a portion of a sense amplifier 90 illustrating the present invention. In this circuit, an inverter 92 between the data output $V_Z$ and the gate 94 of the precharge transistor 96 sets the precharge level close to the flip point of the inverter. The inverter 92 also inverts the data output $V_Z$ to SA. When the transfer bias voltage $V_X$ turns on the pass transistor 116, a dropping data output $V_Z$ level will raise SA, which will turn on the precharge transistor 96 more and cause the data output $V_Z$ level to increase. Conversely, if the data output $V_Z$ level raises, then SA drops, turning off the precharge transistor 96 and allowing $V_Z$ to fall. Thus, the data output $V_Z$ level is biased at a certain level designed to be slightly lower than the flip point of the inverter 92. When a high threshold cell is read, the data line DL level goes up, decreasing the transfer bias voltage $V_X$ and shutting off the pass transistor 116. The pull-up transistor 98 pulls the data output $V_Z$ level higher, driving SA low. Since the designed precharge level is near the flip point of the inverter, only a small increase is needed to be supplied by the pull-up transistor, and this transistor can be relatively small to the precharge and pass transistors, for example.

FIG. 3B is a simplified schematic representation of a sense amplifier according to an embodiment of the present invention. Referring to the inverter 92 of FIG. 3A, a complementary pair of MOS transistors 100, 102 form a sensing inverter 92' that inverts the data output $V_Z$ to a sense amplifier output SA and also provides the inverted data output level to the precharge transistor 96. This sense amplifier consumes little layout area and can operate on low power. The sense amplifier does not need a pre-charge clock, thus the chip area and power consumption otherwise associated with this clock is saved.

Figure 3C:
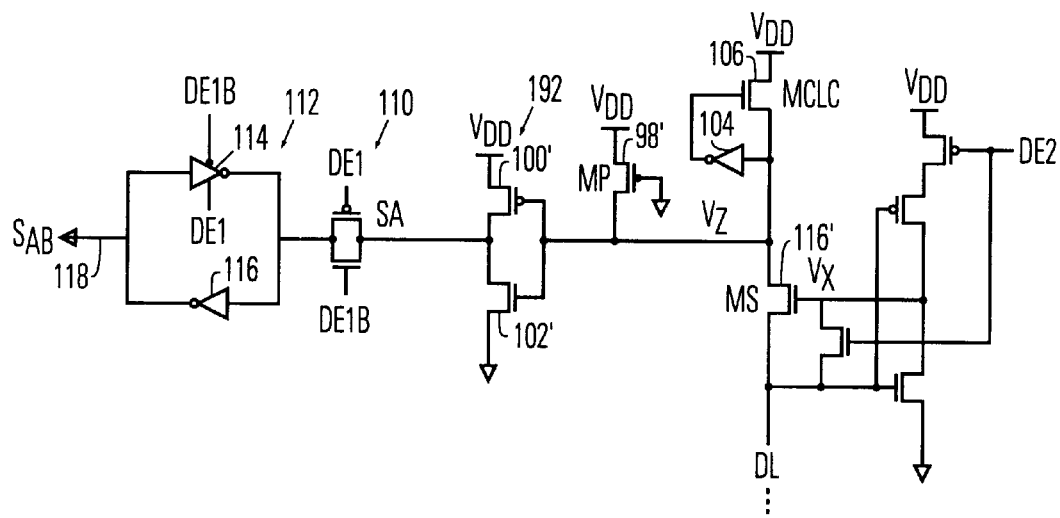
FIG. 3C is a simplified schematic representation of a sense amplifier using a transfer inverter to control precharging according to another embodiment of the present invention.

FIG. 3C is a simplified schematic representation of a sense amplifier according to another embodiment of the present invention. This sense amplifier also has a complementary pair of transistors 100', 102' forming a sensing inverter 192 that inverts the data output $V_Z$ to SA, but also has a transfer inverter 104 controlling the precharge transistor 106 according to the data output level. The pre-charge level can be determined according to the thresholds of the transfer inverter 104 and the pre-charge 106. The transfer inverter 104 is operated in the transition region and establishes the bias point of the pre-charge 106 to provide feedback to the data output $V_Z$. Providing the separate transfer inverter consumes a little more chip area and operating power, but allows design of an operating point independent from the sensing inverter 192. However, the increased power consumption at low $V_{DD}$ levels is not prohibitive. Using the CMOS sensing inverter to control the precharge transistor, as illustrated in FIG. 3B, is simpler and consumes less power, but speed is slightly increased.

The sense amplifier output SA is provided to a pass gate 110 and then to a latching circuit 112. The latching circuit includes one inverter 114 controlled by clock signals DE1 and DE1B and a second inverter 116 in a loop configuration. The output 118 ($S_{AB}$) is thus the sensed and latched data value read from the memory cell (not shown in this figure, refer to FIGS. 1B–1D).

The pre-charge stage and the sensing stage are combined so that sensing starts when pre-charging is done. In other words, the precharge transistor 106 also serves as the sensing transistor. The pass transistor 116' is similar in operation to pass transistors in other circuits, but is given a different reference numeral because the characteristics of the pass transistor, such as the length and width of the active region can be selected to optimize performance in the various sense amplifiers for the designed operating conditions.

Circuits according to FIGS. 3B and 3C do not need a precharge clock signal (refer to DEA, FIG. 2A). Precharging is automatically shut down at a data output $V_Z$ level corresponding to "1". Precharging starts when the sense amplifier is enabled. The data output $V_Z$ level is at a level slightly lower than the flip point of the next inverter (ref. num. 92' in FIG. 3B and ref num. 192 in FIG. 3C). If a low threshold cell is read, current flows through the cell, the pass transistor 116' is on, and the data output $V_Z$ level is at the same level as from the precharge period. If a high threshold cell is read, no current flows through the cell, the pass transistor is off, and the data output $V_Z$ level is pulled up by the pull-up transistor 98' over the flip point of the next inverter (the sense inverter 192) to a data output $V_Z$ "0" level. Since the initial data output $V_Z$ level is close to the flip point of the next inverter, pull-up is very fast and reading a high threshold cell is very fast.

The precharge path is feedback connected, either through the sensing inverter or a transfer inverter, so the precharge gradually slows down, thus avoiding the overshoot that can occur when the precharge is clocked. Reading the tail bit is less of a concern because the default data output level is "1", and little current needs to flow through the cell associated with the tail bit in a low threshold state.

Figure 4A:
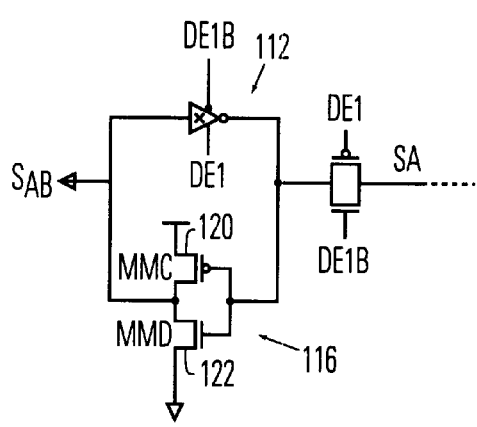
FIG. 4A is a simplified circuit diagram of a latch portion of a sense amplifier circuit according to an embodiment of the present invention.

FIG. 4A is a simplified circuit diagram of a latching circuit 112 with an inverter 116 formed from a pMOS transistor 120 and an NMOS transistor 122. This latching circuit can be used in the circuits illustrated in FIGS. 3B and 3C, above, for example. However, some current might flow through the pMOS transistor 120 even when the data latching circuit is not active (i.e. not clocked, or in "standby" mode). When a low threshold cell is read, the data output $V_Z$ is at a relatively low level, but not ground, and the sense amplifier output SA is at a relatively high level, but not $V_{DD}$. Therefore, DC current might flow through the nMOS 122 and pMOS 120 transistors. While the DC current flow might be acceptable in 1.8V or lower designs, the DC current might be objectionable in circuits operating at 3V or higher.

Figure 4B:
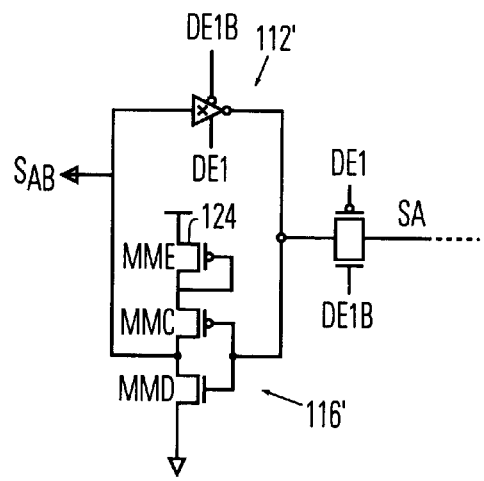
FIG. 4B is a simplified circuit diagram of a latch portion of a sense amplifier circuit according to another embodiment of the present invention.

FIG. 4B is a simplified circuit diagram of a latching circuit 112' that avoids the problem of DC current flow associated with the circuit illustrated in FIG. 4A. The diode connected pMOS transistor 124 lowers the flip point of the inverter 116' so that little DC current flows through the inverter in standby. This circuit can reduce the DC power requirements of the sense amplifier circuit compared to the circuit illustrated in FIG. 4A by more than 25% under some operating conditions, with a minimal increase in speed. The sensing speed might increase about 2 nS compared to the sense amplifier circuit of FIG. 4A.

FIG. 5 is a simplified circuit diagram of a pull-up portion 130 of a sense amplifier according to an embodiment of the present invention. The gate 132 of the pull-up transistor 198, rather than being connected to ground, as shown in FIGS. 3B and 3C, is connected to the gate 134 of another pMOS transistor 136. This second pMOS transistor 136 is connected in series with a cell, modeled as a current source 138. The second pMOS transistor is diode connected. Current flowing through the second pMOS transistor 138 biases the common gate connection as a result of the voltage drop across the second pMOS transistor. This turns on the pull-up transistor 198 to provide a current that is some fraction of the cell current. Therefore the pull-up transistor can track the cell current well and forms a current mirror. A mini array can be used to provide the reference cells.

Generally speaking, the current through the pull-up transistor should be less than the minimum cell current in both slow corner and fast corner switching conditions to avoid latching the wrong data. Since the cell current might not be known, one can estimate the worst case condition; however, this does not optimize the pull-up path. In general, the current through the pull-up transistor should be some fraction, such as 70%, of the cell current. This allows tracking of the cell current and improves both sensing margin and sensing speed and is referred to as a "weak" pull-up.

The pass transistor should be sufficiently large to maintain sensing speed, but not so large as to unduly damp the data output line $V_Z$, which could also affect sensing speed. The size of the pass transistor should be chosen for acceptable speed in both fast and slow corner clock conditions. If the word line delay increases, the pre-charge/sense transistor and the pass transistor can be reduced in size to reduce $V_Z$ damping. If the word line delay decreases, the pre-charge/sense transistor and the pass transistor can be enlarged to improve sensing speed.

Sense amplifiers according to the present invention can achieve advantages in speed over the sense amplifier illustrated in FIG. 2A, for example, if the word line is turned off early. Using a sense amplifier in accordance with FIG. 2B, in a low $V_{DD}$ application, over 40 ns improvement in switching speed can be obtained if the word line can be turned off as $Y_S$ goes low. Referring again to FIG. 1B, $Y_S$ is a switch signal applied to a switch connecting the DL node to a memory cell, which controls whether the data line is coupled to the bit line and hence to the cell.

Figure 6:
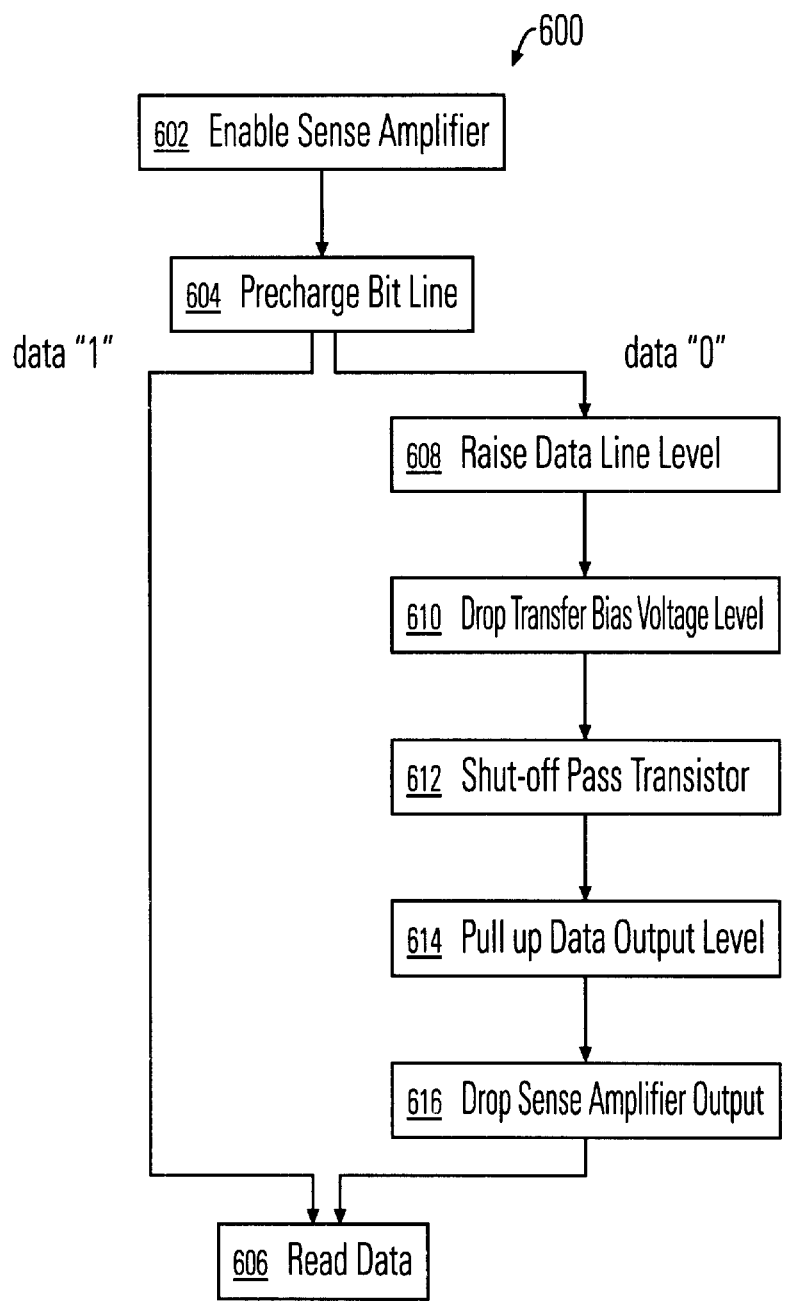
FIG. 6 is a simplified flow chart of a process for reading data with a sense amplifier according to an embodiment of the present invention.

FIG. 6 is a simplified flow chart of a process of operating a sense amplifier 600 in accordance with an embodiment of the present invention. The sense amplifier is enabled (step 602) and the data line (or bit line) is precharged (step 604) before reading a cell. If the cell is in a low threshold state, the data is read (step 606). If the cell is in a high threshold state, the data line level rises (step 608), dropping the transfer bias voltage (step 610), which shuts off the pass transistor (step 512). With the pass transistor shut off, the data output level is pulled up over the flip point of the sensing inverter (step 614), dropping the sense amplifier output SA (step 616) before the data is read (step 506). Thus, for a high threshold cell the data output level is higher and the data line is higher, and for a low threshold cell the data output level is lower and the data line is lower.

Figure 7:
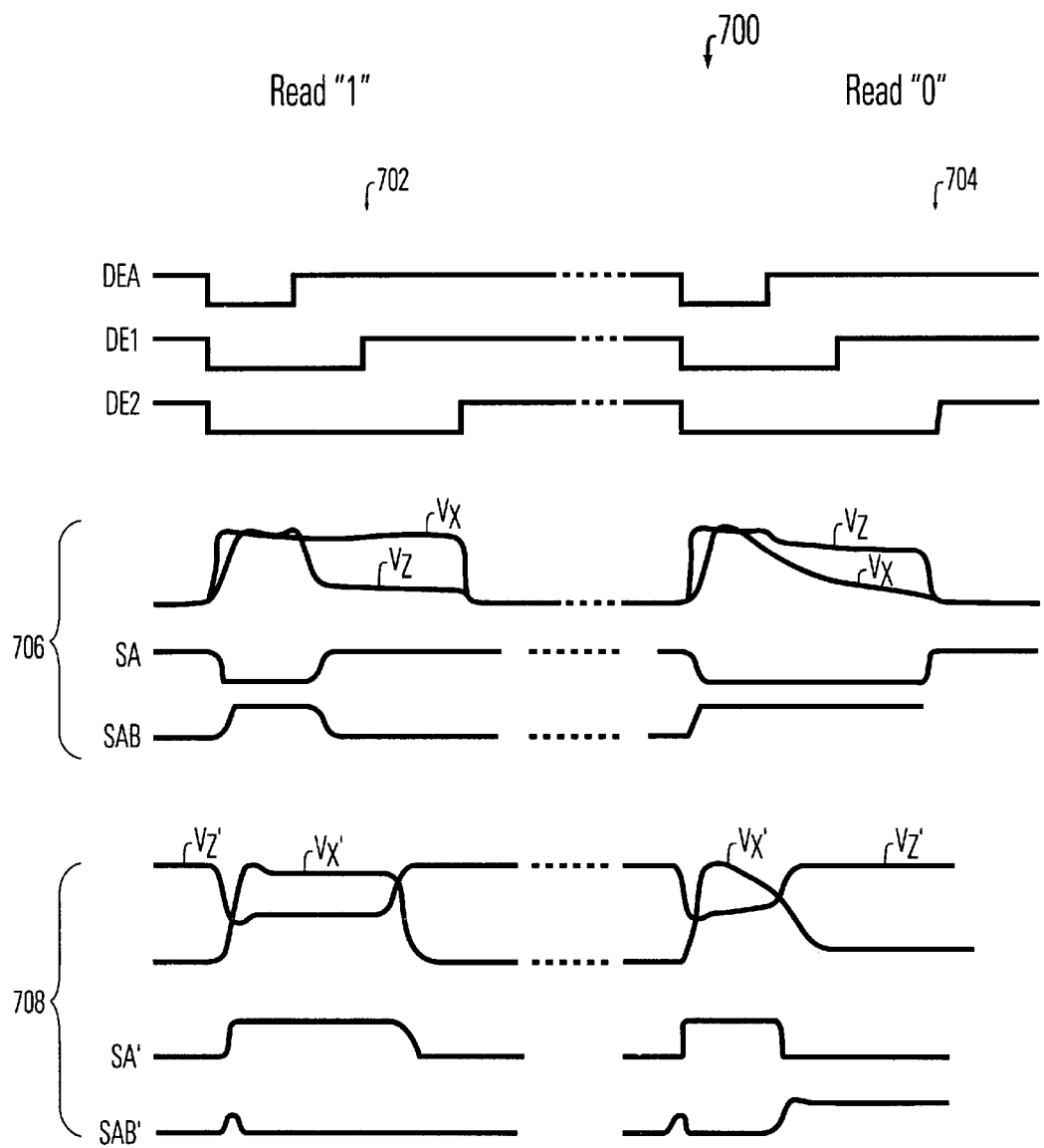
FIG. 7 is a simplified timing diagram comparing signal levels for a sense amplifier with a timed pre-charge circuit with the signal levels for a sense amplifier according to the present invention for reading a high threshold cell and a low threshold cell.

FIG. 7 is a simplified read speed diagram 700 comparing operation of a clocked sense amplifier, such as one illustrated in FIG. 2A with a read simulation for a sense amplifier according to FIG. 3B or FIG. 3C for similar operating conditions. The clock signals DEA, DE1, and DE2 are shown at the top of the figure for reference. Two clock cycles are illustrated, the first clock cycle 702 compares various voltage levels reading a low threshold cell and the second clock cycle 704 compares the voltage levels reading a high threshold cell. The first set 706 of curves represent the voltage levels for the clocked sense amplifier in accordance with FIG. 2A. The second set 708 of curves represent the voltage levels for a sense amplifier with an auto-shutdown precharge path in accordance with the present invention, such as is illustrated in FIG. 3B or 3C. The transfer bias voltage $V_X$ level, data output $V_Z$ level, sense amplifier output SA and the latched data output $S_{AB}$ are shown. The voltage values are omitted for clarity of illustration, the relative voltage values, e.g. when a signal flips from one state to another, being relevant to compare the operation of the devices.

Note the difference in the initial levels of $V_Z$ arising from the difference in the default data value ("0" for group 706 and "1" for group 708). The data in the sense amplifier of group 708 has been sensed out ($S_{AB}$ signal flip) before the sense amplifier of group 706 has finished its pre-charge period. These simulation results illustrate an expected improvement of over 40 ns in read speed.

In the embodiments of the invention described above in reference to FIGS. 3B and 3C, defaulting to a data output "1" condition saves time compared to defaulting to a data output "0" condition. The latter case may require the bitline level to first go high and then low, as in the circuit illustrated in FIG. 2A. Defaulting to the data output "1" condition allows biasing the output $V_Z$ to a level just below the trip point of the next stage, which is typically a CMOS sensing inverter, further improving speed.

By connecting the gate of the weak pull-up transistor to ground, rather than configuring the weak pull-up as a diode-configured FET, DC leakage current through the CMOS inverter of the data latch stage is avoided. Grounding the gate of the weak pull-up transistor also reduces loading of the data output line $V_Z$. In general, the speed of a 128 M MROM device can be improved from a 200 ns grade to a 100 ns grade at low $V_{DD}$ (1.8 V specification) without a penalty in layout or power consumption by utilizing a sense amplifier according to an embodiment of the present invention.

The invention has been described with reference to specific exemplary embodiments. Various modifications and changes may be made without departing from the spirit and scope of the invention. For example, a positive bias voltage $V_{DD}$ has been used in illustrative embodiments, but a negative bias voltage might be used with suitable accommodation in the types of transistors. Similarly, an additional inverter might be provided in the feedback path with the pre-charge transistor being a p-channel device. Devices used to illustrate embodiments have generally been modeled according to devices fabricated in silicon, but other modeling parameters could be used, including parameters relating to other types of semiconductor materials. "MOS" transistors may include devices that use doped polysilicon or silicide, rather than a metal, for conductive layers. Accordingly, the specification and drawings are to be regarded as being illustrative, and not as being restrictive, the invention being limited according to the following claims.

What is claimed is:

1. A sense amplifier having and input node configured to be connected to a bitline of a memory array, the sense amplifier comprising:
   a transistor having a first conduction terminal connected to the input node and a second conduction terminal connected to an output node;
   an inverter having an inverter input coupled to the output node and an inverter output;
   a pre-charge transistor having
      a pre-charge control terminal coupled to the inverter output,
      a first pre-charge conduction terminal configured to be connected to a voltage supply providing a bias voltage, and
      a second pre-charge conduction terminal connected to the output node; and
   a pull-up transistor having a first conduction terminal connected to the supply voltage and a second conduction terminal connected to the output node.

2. The sense amplifier of claim 1 wherein the inverter is a sensing inverter disposed between the output node and a pass gate.

3. The sense amplifier of claim 1 further comprising a sensing inverter disposed between the output node and a pass gate.

4. The sense amplifier of claim 1 further comprising
   a data latch circuit including
      a data latch inverter having a complementary pair of transistors having a common gate connection coupled to a sensing inverter through a pass gate; and a diode connection disposed between the voltage supply and the complementary pair of transistors.

5. The sense amplifier of claim 1 further comprising a sensing inverter coupled to the output node and having a threshold voltage, wherein the pre-charge transistor is configured to set a pre-charge level on the output node below the threshold voltage of the sensing inverter.

6. The sense amplifier of claim 1 including a current mirror transistor having a gate terminal, wherein the pull-up transistor gate terminal is connected to the current mirror transistor gate terminal.

7. The sense amplifier of claim 1 wherein the pull-up transistor is a p-channel enhancement mode metal-oxide-semiconductor field-effect transistor with a gate terminal connected to a ground potential, the bias voltage being greater than the ground potential.

8. The sense amplifier of claim 1, including a circuit coupled between the input node and a control terminal on the transistor that causes the transistor to become less conductive at a first input node voltage and causes the transistor to become more conductive at a second input node voltage, the first input node voltage being higher than the second input node voltage.

9. The sense amplifier of claim 8 wherein the circuit is a second inverter.

10. The sense amplifier of claim 8 wherein the circuit is a transfer bias network.

11. A sense amplifier having an input node configured to be connected to a bit line of a memory array, the sense amplifier comprising:
   a pass transistor having
      a first pass conduction terminal connected to the input node,
      a second pass conduction terminal connected to an output node, and
      a pass control terminal;
   a first inverter having a first inverter input coupled to the input node and a first inverter output coupled to the pass control terminal;
   a second inverter having a second inverter input coupled to the output node and capable of providing a pre-charge bias voltage at a second inverter output;
   a pre-charge transistor having
      a control terminal coupled to the second inverter output,
      a first conduction terminal configured to be connected to a voltage supply providing a bias voltage, and
      a second conduction terminal connected to the output node; and
   a pull-up transistor having
      a first pull-up conduction terminal configured to be connected to the voltage supply and
      a second conduction terminal connected to the output node.

12. The sense amplifier of claim 11, wherein a control terminal of the pull-up transistor is connected to a ground potential.

13. A sense amplifier having an input node configured to be connected to a bit line of a memory array, the sense amplifier comprising:
   a pass transistor having a first pass conduction terminal connected to the input node and a second pass conduction terminal connected to an output node;
   an inverter having an inverter input coupled to the output node and an inverter output;
   a pre-charge transistor having
      a control terminal coupled to the inverter output,
      a first conduction terminal configured to be connected to a voltage supply providing a bias voltage, and
      a second conduction terminal connected to the output node;
   a pull-up transistor having
      a first pull-up conduction terminal configured to be connected to the voltage supply,
      a second pull-up conduction terminal connected to the output node, and
      a gate terminal of the pull-up transistor connected to a ground potential; and
   a latch circuit having
      a second inverter including a complementary pair of transistors with a common control node coupled to the inverter output, and
      a diode connection connected in series with the complementary pair of transistors between the voltage supply and the ground potential.

14. The sense amplifier of claim 13 including a circuit coupled between the input node and a control terminal on the pass transistor that causes the pass transistor to become less conductive at a first input node voltage and causes the pass transistor to become more conductive at a second input node voltage, the first input node voltage being higher than the second input node voltage.

15. The sense amplifier of claim 14 wherein the circuit comprises a third inverter.

16. The sense amplifier of claim 14 wherein the circuit comprises a transfer bias network.

17. The sense amplifier of claim 13 wherein the inverter is a sensing inverter disposed between the output node and a pass gate.

18. A method of operating a sense amplifier, the method comprising:
   inverting a first output level at an output node of the sense amplifier to create an inverted output;
   coupling the inverted output to a control terminal of a pre-charge transistor;
   pre-charging the output node to a second output level below a threshold of a data latch stage, the data latch stage having a latch input coupled to the output node;
   shutting off a transistor having a first conduction terminal coupled to the output node and a second conduction terminal coupled to a data line; and
   pulling up the output node to a third output level above the threshold level of the data latch stage when the transistor is shut off.

* * * * *

UNITED STATES PATENT AND TRADEMARK OFFICE
CERTIFICATE OF CORRECTION

PATENT NO. : 6,535,026 B2  Page 1 of 1
DATED : March 18, 2003
INVENTOR(S) : Cheng-Lin Chung and Nien-Chao Yang It is certified that error appears in the above-identified patent and that said Letters Patent is hereby corrected as shown below:

Title page and Drawings
Sheet 5 of 8, Figure 3B, please delete the horizontal line directly above reference numeral 100.

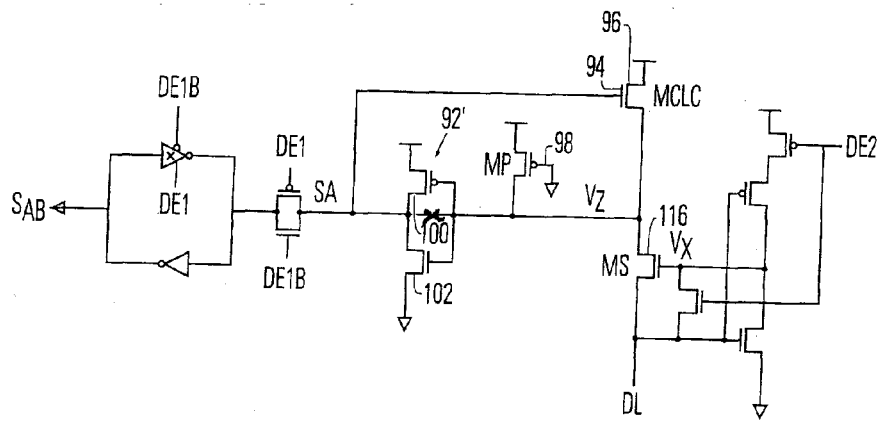

FIG. 3B

Signed and Sealed this

Ninth Day of September, 2003

JAMES E. ROGAN
*Director of the United States Patent and Trademark Office*